United States Patent [19]
Hooper

[11] Patent Number: 4,829,300
[45] Date of Patent: May 9, 1989

[54] SIGNAL GENERATION

[75] Inventor: Raymond C. Hooper, Ipswich, England

[73] Assignee: British Telecommunications, London, England

[21] Appl. No.: 928,179

[22] PCT Filed: Mar. 6, 1986

[86] PCT No.: PCT/GB86/00126
§ 371 Date: Dec. 10, 1986
§ 102(e) Date: Dec. 10, 1986

[87] PCT Pub. No.: WO86/05309
PCT Pub. Date: Sep. 12, 1986

[30] Foreign Application Priority Data

Mar. 7, 1985 [GB] United Kingdom ............... 8505940
Apr. 18, 1985 [GB] United Kingdom ............... 8509983
Apr. 18, 1985 [GB] United Kingdom ............... 8509987

[51] Int. Cl.$^4$ ............................................. H04B 9/00
[52] U.S. Cl. .................................... 341/102; 341/103; 341/86; 455/608
[58] Field of Search ............. 340/347 DD; 350/96.16; 455/608–612; 341/86, 102, 106

[56] References Cited

U.S. PATENT DOCUMENTS

| | | | |
|---|---|---|---|
| 3,518,660 | 6/1970 | Nicklas | 340/347 DD |
| 3,521,068 | 7/1970 | Armstrong . | |
| 3,750,147 | 7/1973 | Gregg | 340/347 DD |
| 3,789,390 | 1/1974 | Burkness | 340/347 DD |
| 4,020,282 | 4/1977 | Halpern . | |
| 4,227,175 | 10/1980 | Newman . | |
| 4,495,656 | 1/1985 | Shaw | 455/608 |
| 4,507,776 | 3/1985 | Smith . | |

FOREIGN PATENT DOCUMENTS 2540796 4/1976 Fed. Rep. of Germany .
2450539 9/1980 France .
WO85/04064 9/1985 PCT Int'l Appl. .
1540907 9/1979 United Kingdom .
2067055 7/1981 United Kingdom .

OTHER PUBLICATIONS

Optical & Quantum Electronics, vol. 12, No. 1. Jan. 1980, Chapman & Hall Ltd. "On–line codes for digital optical communications".
Electronics letters, vol. 19, No. 9, Apr. 28, 1983; Hitchin, Hertz, GB; K. A. Schouhamer Immink; "Run-length-limited code with small error propagation."
Journal of Lightwave Technology, vol. LT—3, No. 1, Feb. 1985; H. Haga; "An integrated 1×4 high-speed optical switch and its applications to . . . ".
IBM Technical Disclosure Bulletin, vol. 24, No. 5, Oct. 1981, M. Thewalt; "Time domain multiplexing of signals on an optical fiber using . . . ".
Journal of Lightwave Technology, vol. LT-3, No. 1, Feb., 1985, S. K. Korotky et al; "Fully connected high--speed Ti:LiNbO$_3$ switch/modulator . . . ".
IEEE Transactions on Microwave Theory and Techniques, vol. MTT—30, No. 10, Oct. 1982, M. Kondo et al.; "Integrated optical switch matrix for . . . ".

Primary Examiner—William M. Shoop, Jr.
Assistant Examiner—Gary J. Romano
Attorney, Agent, or Firm—Nixon & Vanderhye

[57] ABSTRACT

A method and apparatus for generating signals representing a plurality (p) of n bit words corresponding to respective input signals. The apparatus comprises a basic word generator (7) for generating first signals representing m basic words (A–D) whereby the p words are the same as or are cyclic rearrangements of the n bits of the m basic words. Control means including combinatorial logic (33) determines the one of the p words corresponding to each input signal and generates corresponding control signals. Selection means including optical modulators (10-13, 20-25) are responsive to the control signals for selecting the appropriate first signal, if necessary after recycling by imposing selected delays, to constitute an output signal corresponding to the determined one of the p words.

13 Claims, 3 Drawing Sheets

Fig.1. ENCODER

DETECTOR THRESHOLDS

SIGNAL GENERATION

It is common practice in line transmission systems to code data which is transmitted. This line coding serves a number of purposes. Firstly, digital repeaters must be able to extract a clock signal from the transmitted data and thus it is advantageous to transmit sequences of digits having frequent transitions and to avoid long sequences of like digits. Line coding also helps to detect errors in transmission and to restrict the frequency spectrum of transmitted signals so that supervisory signals can be transmitted. It is also useful to ensure that as far as possible the characteristics of the transmitted signals match those of the total medium.

In optical fibre transmission systems binary codes have proved advantageous and in particular the balanced disparity a, (a+1) Binary codes (a odd) are much used. Code and decode operations can be quite complex, particularly at the decoder, and especially at high information rates, of the order of GBit/s obtainable with optical transmission systems. Commercial logic is not yet available for dealing with this, In the past, the coding and decoding of information has been achieved using look-up stables constituted by ROMs. This is expensive and generally impractical in the case of high bit rates.

In accordance with one aspect of the present invention, a method of generating signals representing a plurality (p) of n bit words corresponding to respective input signals comprises continuously generating first signals representing m basic words whereby the p words are the same as or are cyclic rearrangements of the n bits of the m basic words, detecting the input signals, determining the one of the p words corresponding to each detected input signal, and selecting the appropriate first signal, if necessary after recycling, to consitute an output signal corresponding to the determined one of the p words.

In accordance with a second aspect of the present invention, apparatus for generating signals representing a plurality (p) of n bit words corresponding to respective input signals comprises a basic word generator for generating first signals representing m basic words whereby the p words are the same as or are cyclic rearrangements of the n bits of the m basic words, control means for determining the one of the p words corresponding to each input signal and for generating corresponding control signals, and selection means responsive to the control signals for selecting the appropriate first signal, if necessary after recycling, to constitute an output signal corresponding to the determined one of the p words.

The invention makes use of a particularly suitable codeword system based on the balanced disparity approach in which a majority of the codewords have the same number of digits of each logical type. In such a codeword system, a variety of different codewords can be generated simply by cycling the digits of the basic words.

Preferably, recycling is achieved by selectively delaying and sampling the first signals.

This method of recycling does not require expensive logic and conveniently can be implemented by providing the selection means as a plurality of delay units for imposing time delays on the first signals before the first signals reach corresponding sampling means, the sampling means being responsive to the control signals to pass a selected one of the first signals to a common outport port.

This method of achieving recycling is particularly applicable in the case where the first signals comprise optical signals enabling a large proportion of the coding to take place in the optical domain.

By using the recycling property, m will be less than p thereby simplifying the apparatus and reducing its cost and complexity.

In one example, in which the bits of at least some of the basic words are logically complemental, as hereinafter defined, the basic word generator includes one or more logic units for generating the complemental basic words.

A pair of basic words are hereindefined as "logically complemental" if each bit of one word is the logical complement of the corresponding bit in the other word. For example, 0101 is logically complemental to 1010.

In accordance with a third aspect of the present invention, a method of generating output signals representing a plurality (x) of y bit words corresponding to a plurality (p) of n bit word input signals comprises continuously generating reference signals representing all possible p words, correlating each input signal with the generated reference signals, whereby each input signal has a unique correlation with a respective one of the test signals and generating one of the x output signals corresponding to the correlated input signal.

This method provides a particularly simple way of decoding incoming coded information.

In accordance with a fourth aspect of the present invention, apparatus for generating output signals representing a plurality (x) of y bit words corresponding to a plurality (p) of n bit word input signals comprises reference signal generating means for continuously generating reference signals representing all possible p words, correlation means for correlating each input signal with the generated reference signal, whereby each input signal has a unique correlation with a respective one of the reference signals, and for generating one of the x output signals corresponding to the uniquely correlated input signal.

Some examples of methods and apparatus in accordance with the present invention will now be described with reference to the accompanyng drawings, in which.

A large variety of code systems may be implemented using methods and apparatus according to the invention but for the present purposes, a 3B-4B encoder and decoder will be described. An example of a code system is set out in Table 1 below:

TABLE

| Input word | Output word |
|---|---|
| 000 | 0001 or 1110 |
| 001 | 0011 |
| 010 | 0101 |
| 011 | 0110 |
| 100 | 1001 |
| 101 | 1010 |
| 110 | 1100 |

TABLE-continued

| Input word | Output word |
| --- | --- |
| 111 | 0010 or 1101 |

The balanced disparity approach adopted here gives rise to all of the zero disparity words being allocated. The remaining two input words have two output words each allocated to them having equal but opposite disparity. These two words are used in an alternate fashion such that the running digital sum variation is minimised. The remaining unallocated words are useful in the sense that they assist decoding. If such words are registered at the decoder, the decoder is resynchronised until allowed words only are registered.

We have recognised that the output words listed above may be broken down into four basic words with the remaining six words being produced simply by recycling the digits of some of the basic words. This is illustrated in Table 2 below.

TABLE 2

| Input word | Output word | Type | No of cycles |
| --- | --- | --- | --- |
| 000 | 0001 | C | 0 |
|  | 1110 | D | 0 |
| 001 | 0011 | A | 2 |
| 010 | 0101 | B | 1 |
| 011 | 0110 | A | 3 |
| 100 | 1001 | A | 1 |
| 101 | 1010 | B | 0 |
| 110 | 1100 | A | 0 |
| 111 | 0010 | C | 1 |
|  | 1101 | D | 1 |

Figure 1:
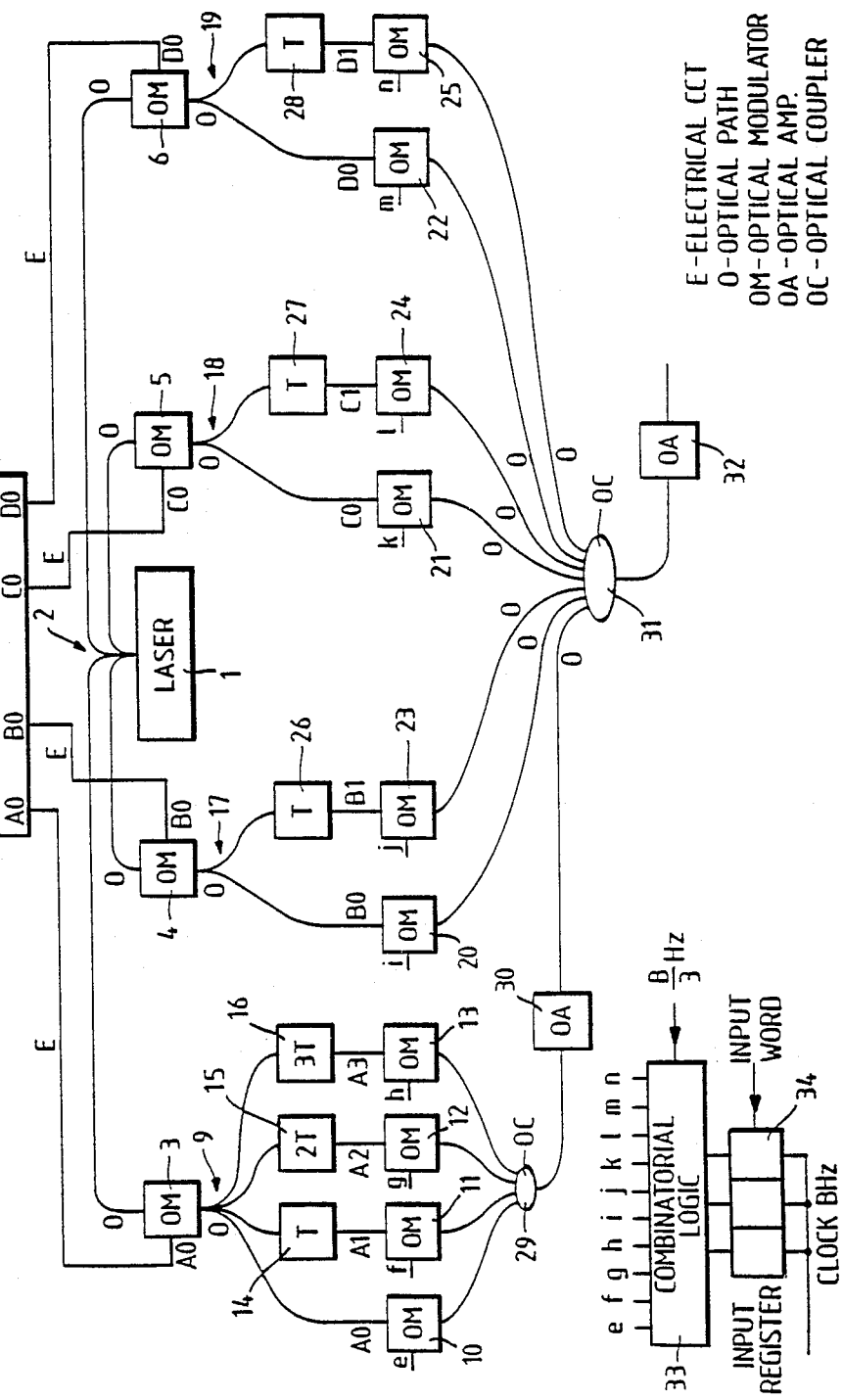
FIG. 1 is a schematic block diagram of an encoding system.

An example of an encoder for generating the output words of Table 2 in this manner is illustrated in FIG. 1. A cw laser 1 is coupled via an optical fibre to a four way fiber splitter 2 having four output optical fibres connected to respective electro-optic modulators or switches 3-6. A basic word generator 7 for controlling the generation of the basic words A-D is connected to a clock source 8 and generates electrical outputs for controlling the modulators 3-6.

The optical output from the modulator 3 is fed to a four way optical splitter 9 one output of which is connected directly to a modulator 10 while the other outputs are connected to modulators 11-13 via delay units 14-16 respectively. The delay units 14-16 impose delays on the incoming optical signals of T, 2T and 3T respectively (T=3/(4B)) and are most simply constituted by different, appropriate lengths of optical fibre.

The modulators 4-6 have optical outputs connected respectively to two way optical splitters 17-19 one output of which is connected directly to respective modulators 20-22 while the other output is connected to respective modulators 23-25 via delay units 26-28. Each of the delay units 26-28 imposes a delay of T seconds.

The optical outputs from the modulators 10-13 are fed to an optical coupler 29 whose output is fed via an optical amplifier 30 to a further optical coupler 31 to which the optical outputs from the modulators 20-25 are also fed. The output from the optical coupler 31 constitutes the encoded output signal which is fed via an optical amplifier 32 to an output port.

The basic word generator 7 controls modulation of the optical modulators 3-6 so that the basic words A-D are repeatedly generated at the optical outputs of the modulators. Consider now the data arriving at successive instants at the optical modulators 10-13. Since delays are imposed by the delay units 14-16 the sequence of digits arriving for example at the optical modulator 11 will be delayed by one digit with respect to the sequence arriving at the optical modulator 10. Similarly, the digits arriving at optical modulators 12, 13 will be delayed by two and three digits respectively. Thus, cycling of the digits is achieved in the optical domain by imposing delays on the signal representing the basic word.

In a similar way the additional bit sequences to be generated from the basic words B-D are generated by providing single delays of T seconds.

Operation of the modulators 10-13 and 20-25 is controlled by a combinatorial logic device 33 clocked at B/3Hz which detects an incoming three bit word which is fed in parallel from an input register 34. The logic 33 has ten outputs labelled e-n connected to the modulators 10-13 and 20, 23, 21, 24, 22, and 25 respectively. The logic 33 determines which of the optical modulators is to be selected to pass the incoming optical signal to the optical coupler 31. The ten outputs from the logic 33 are latched for 3/B seconds allowing the four bit output word through to the optical coupler 31.

The optical modulators or switches 10-13, 20-25 could be integrated on a single substrate with good isolation between devices. These components would need to be moderately low loss with high extinction.

Figure 2:
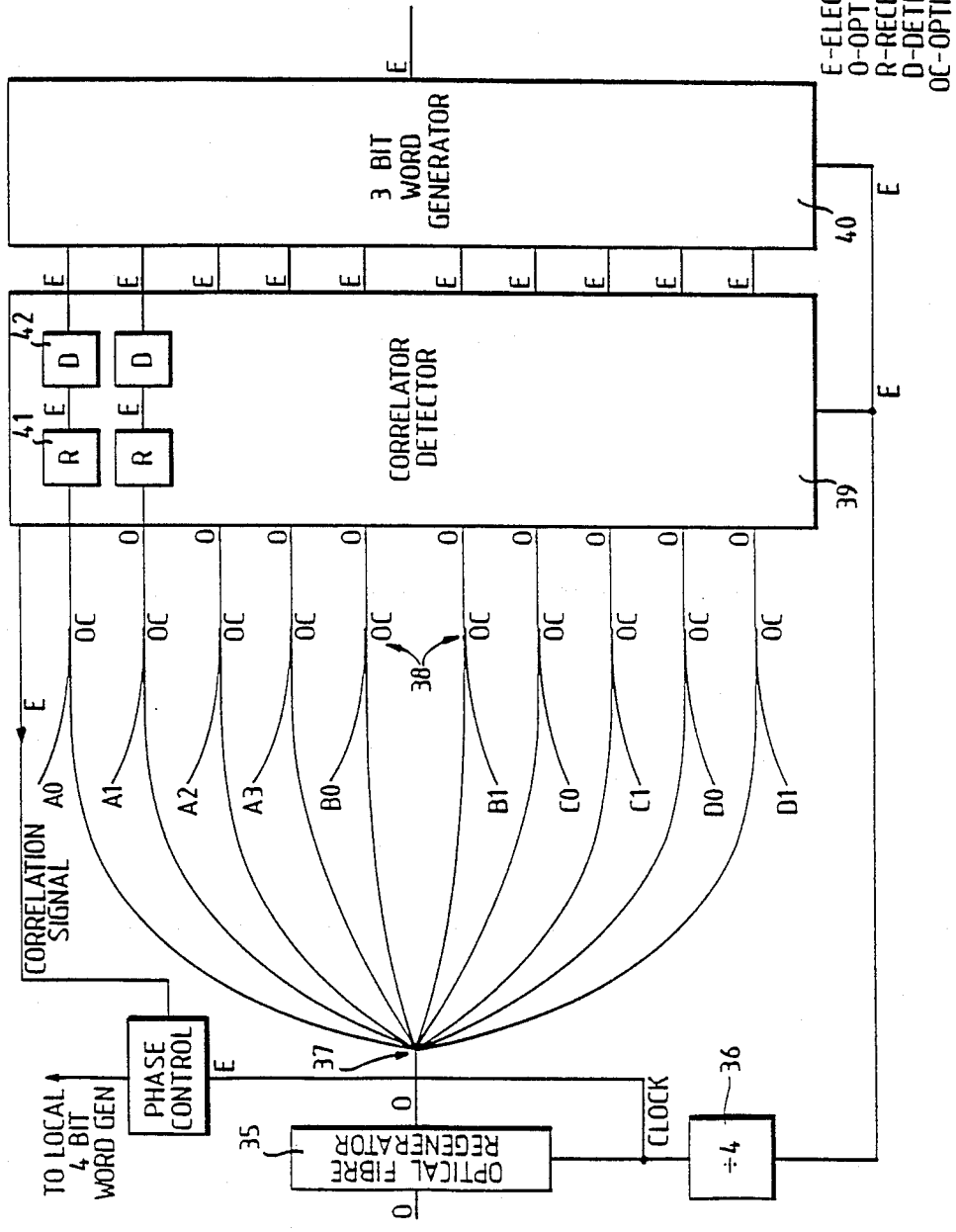
FIG. 2 is a schematic block diagram of a decoding system.
Figure 3:
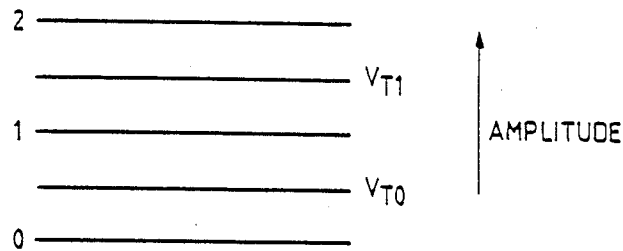
FIG. 3 illustrates operation of the correlator shown in FIG. 2.

A decoding system is illustrated in FIGS. 2 and 3 for decoding optical input signals constituted by any of the output words illustrated in Table 2 above. The incoming encoded signal is passed through an optical fibre regenerator 35 where extraction of the clock signal at 4B/3 Hz takes place. The clock signal is fed to a ÷4 circuit 36 whose output signal is used to control the decoding process and timing of the translated output words. The principle used in decoding is correlation whereby all possible four bit code words are generated at the decoder and compared with the incoming word. Generation of the codewords is conveniently performed by apparatus similar to that shown in FIG. 1 but instead of the outputs of the optical modulators 10-13, 20-25 being fed to optical couplers they are fed individually to respective optical output fibres from an optical splitter 37. The incoming optical signal is fed to an input fibre of the splitter 37. Each of the reference codewords are coupled to respective outputs from the splitter 37 at optical couplers 38 whose outputs are fed to a correlator detector 39. If the signal levels are equal at each input port of the correlator 39 and synchronisation is maintained then if a codeword A2 is received by the regenerator 35 and is coupled with the codeword A0, the output from the corresponding optical coupler will be 1111 since A0=$\overline{A2}$. Such an output is unique to the coupler connected with A0. The multichannel correlator 39 registers that this has occurred and signals a three bit word generator 40 to output the translation for A2, ie. 001. Synchronisation may be achieved by phasing the four bit word generator clock so that the maximum overall correlation from the correlator occurs.

The correlator comprises a plurality of receiver and detector combinations 41, 42. Each receiver provides an electrical output signal in response to the receipt of an optical signal and the output signals are fed to the corresponding detector 42. The effect of each optical coupler 38 is to add corresponding bits of the two input signals together. Thus for example the output from the optical coupler coupling the incoming codeword, in this case A2, with reference codeword A1 will be 1012. Corresponding electrical signals are received by the associated detector 42 which compares transitions between successive bits with thresholds. In this particular example, the unique output for each incoming codeword is 1111. Thus, each detector 42 looks for an incoming set of four birs in which there are no transitions. The maximum transition could be two. This is illustrated schematically in FIG. 3 which indicates that each detector 42 compares the transition between successive bits with two thresholds $V_{t0}$ and $V_{t1}$. If either of these thresholds are crossed then the output from the detector is a logical zero indicating that no correlation has been achieved. In the one case where the incoming word is 1111, neither of the thresholds will be crossed and the detector will issue a logic 1.

In other examples, not shown, using different codeword sets other unique combinations could be devised.

Figure 4:
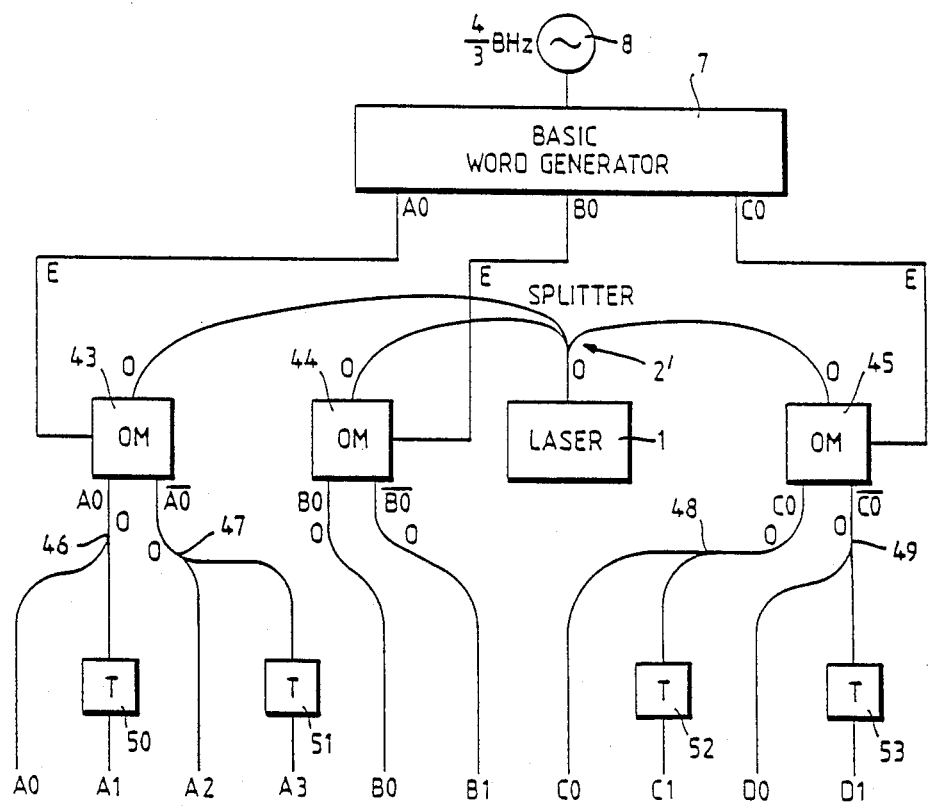
FIG. 4 illustrates a modification of the FIG. 1 example.

FIG. 4 illustrates a modification of the encoder illustrated in FIG. 1. Those elements in FIG. 4 which are the same as those in FIG. 1 have been given the same reference numerals. If reference is made to Table 2 above, it will be seen that some pairs of codewords can be grouped into those which are logical complements of each other. For example, B0 is a logical complement of B1. The apparatus of FIG. 1 can be simplified by making use of this property.

The output from the laser 1 is fed to a three-way optical splitter 2' connected to respective waveguide switches 43, 44, and 45. These are controlled by electrical output signals from the basic word generator 7 and have two outputs which generate logically complemental signals. These are indicated, for example in the case of the waveguide switch 43, by outputs A0, $\overline{A0}$. Thus, for example, if the electrical input signal controlling the waveguide represents a logic 1, the opticl output signals will be a logic 1 from A0 and a logic 0 from ',ovs/A0/

In the case of the waveguide switch 44 the outputs can be used directly to constitute the codewords B0, B1. In the cases of the waveguide switches 43, 45, the output signals are each fed to respective two way optical splitters 46–49. One of the output signals from each splitter is fed to a respective delay unit 50–53 which imparts a delay of T, corresponding to one bit, on the incoming signal. The remaining signals from the splitters 46–49 can be used directly as codewords and it will be noted that in this connection that the codewords A0, A2; and C0, D0 are each logical complements.

The remainder of the encoder can be the same as shown in FIG. 1 although the optical amplifier 30 may not be required in this case since the losses in the A path are reduced.

I claim:

1. A method of generating output signals corresponding to respective input signals, said output signals representing a plurality p of n-bit where p is greater than n words, comprising:
   (a) continuously and simultaneously generating p signals representing said p, n-bit words;
   (b) detecting said input signals;
   (c) determining the one of said p words corresponding to each said detected input signal; and
   (d) selecting the appropriate one of said p signals to constitute said output signal corresponding to the determined one of said p words.

2. A method as in claim 1 in which the p signals representing said p, n-bit words are continuously generated by
   (a) continuously generating m first signals representing m, basic n-bit words where m is less than p;
   (b) continuously generating from said m first signals signals representing those of the p words not being one of said m basic words by cyclicly rearranging the n-bits of an appropriate one of said m first signals.

3. A method in claim 2 in which at least one of said m basic words is the logical complement of one of the other m basic words.

4. A method as in claim 2 or 3 in which said cyclic rearranging is achieved by selectively delaying and sampling at least some of the m first signals.

5. A method as in claim 1, 2 or 3 in which the first signals comprise optical signals.

6. A method as in claim 4 in which the first signals comprise optical signals.

7. Apparatus for generating output signals corresponding to respective input signals, said output signals representing a plurality p of n-bit words where p is greater than n, comprising:
   (a) a word generating means continuously and simultaneously generating p signals representing said p, n-bit words;
   (b) a control means for determining the one of the said p words corresponding to each input signal and for generating corresponding control signals; and
   (c) a selection means responsive to said control signals for selecting the appropriate one of said p signals to constitute the output signal corresponding to the determined one of said p words.

8. Apparatus as in claim 7 in which the word generating means generates continuously and simultaneously m first signals representing m basic words where m is less than p, and recycling means for continuously generating from said m first signals signals representing those of the p words not being one of said m basic words.

9. Apparatus as in claim 8 in which at least one of said m basic words is the logical complement of one of the other m basic words.

10. Apparatus as in claim 8 and 9 in which the recycling means comprises a plurality of delay units for imposing time delays on the first signals before the first signals reacting the selection means.

11. Apparatus as in claim 10 in which the delay units impose delays which are integer multiples of a time T, where 1/T is the bit rate of the input signals.

12. An optical signal encoder for generating one of a predetermined number q of output words having plural binary-valued bit-serial optical signal bits in response to an input word of plural binary-valued bits, said encoder comprising:
   cyclic optical signal generating means for simultaneously and repetitively providing each of said output words at a respectively corresponding one of q optical signal intermediate output ports; and
   gate means arranged in parallel at each of said intermediate output ports to gate the optical signals from a selected one of said intermediate output ports to a common output port in response to the value of said input word.

13. An optical signal decoder for generating one of a predetermined number z output words having plural binary-valued electrical signal bits in response to an input bit-serial optical word of plural binary-valued bits, said decoder comprising:

q-channel correlation means for simultaneously comparing an input bit-serial optical signal word with each of q bit-serial optical signals and for producing an unique correlated output signal on one of q output channels in response thereto; and a multi-bit word generator means connected to all of said q output channels for generating one of z predetermined output words corresponding to the correlated output presented from the correlator.

* * * * *